US011863205B2

(12) United States Patent
Bandyopadhyay et al.

(10) Patent No.: US 11,863,205 B2
(45) Date of Patent: Jan. 2, 2024

(54) ADAPTIVE BIAS TECHNIQUES FOR AMPLIFIERS IN SIGMA DELTA MODULATORS

(71) Applicant: Analog Devices International Unlimited Company, Limerick (IE)

(72) Inventors: Abhishek Bandyopadhyay, Winchester, MA (US); Kaibo Miao, Shanghai (CN); Langyuan Wang, Shanghai (CN)

(73) Assignee: Analog Devices International Unlimited Company, Limerick (IE)

( * ) Notice: Subject to any disclaimer, the term of this patent is extended or adjusted under 35 U.S.C. 154(b) by 89 days.

(21) Appl. No.: 17/538,275

(22) Filed: Nov. 30, 2021

(65) Prior Publication Data

US 2023/0179224 A1  Jun. 8, 2023

(51) Int. Cl.
*H03M 3/00* (2006.01)
*H03M 1/18* (2006.01)

(52) U.S. Cl.
CPC .......... *H03M 3/464* (2013.01); *H03M 1/183* (2013.01); *H03M 3/354* (2013.01); *H03M 3/424* (2013.01); *H03M 3/452* (2013.01); *H03M 3/456* (2013.01); *H03M 3/458* (2013.01)

(58) Field of Classification Search
CPC ...... H03M 3/464; H03M 1/183; H03M 3/354; H03M 3/456; H03M 3/424; H03M 3/452; H03M 3/458
USPC ....................................................... 341/143
See application file for complete search history.

(56) References Cited

U.S. PATENT DOCUMENTS

| | | | |
|---|---|---|---|
| 5,589,831 A | 12/1996 | Knee | |
| 5,691,720 A | 11/1997 | Wang et al. | |
| 6,577,258 B2 | 6/2003 | Ruha et al. | |
| 7,158,064 B2 | 1/2007 | Jensen | |
| 7,295,645 B1 | 11/2007 | El-ghoroury et al. | |
| 7,317,411 B1 | 1/2008 | Nanda et al. | |
| 7,750,837 B2 | 7/2010 | Wang et al. | |
| 7,768,433 B2 | 8/2010 | Mathe et al. | |
| 7,944,385 B2 * | 5/2011 | Le Guillou | H03M 3/386 341/143 |
| 8,120,425 B2 | 2/2012 | Fayed et al. | |
| 8,299,844 B2 | 10/2012 | Garverick et al. | |
| 8,421,541 B2 | 4/2013 | Sengupta et al. | |
| 8,610,465 B2 | 12/2013 | Jansson | |
| 8,610,493 B2 * | 12/2013 | Kim | H03F 3/45475 323/299 |

(Continued)

FOREIGN PATENT DOCUMENTS

CN    116208165 A    6/2023

OTHER PUBLICATIONS

Chae, Hyungil, "Low Power Continuous-time Bandpass Delta-Sigma Modulators", Ph.D Dissertation, U of Michigan, (2013), 112 pgs.

*Primary Examiner* — Khai M Nguyen
(74) *Attorney, Agent, or Firm* — Schwegman Lundberg & Woessner, P.A.

(57) ABSTRACT

An apparatus comprises a sigma-delta analog-to-digital converter (ADC) circuit configured to convert an analog input signal to a digital value. The sigma-delta ADC circuit includes a loop filter circuit including at least one loop filter amplifier, a flash ADC circuit including multiple comparators, and a bias control circuit configured to change a biasing of the at least one loop filter amplifier according to outputs of the multiple comparators of the flash ADC circuit.

20 Claims, 9 Drawing Sheets

(56) References Cited

U.S. PATENT DOCUMENTS

| | | |
|---|---|---|
| 9,148,168 B2 | 9/2015 | Li et al. |
| 9,350,380 B2 * | 5/2016 | Chen .................... H03M 1/002 |
| 9,680,496 B2 * | 6/2017 | Kauffman ............... H03M 1/46 |
| 9,762,259 B1 | 9/2017 | Pu et al. |
| 9,912,144 B2 * | 3/2018 | Caldwell ................. H03M 3/30 |

* cited by examiner

ADAPTIVE BIAS TECHNIQUES FOR AMPLIFIERS IN SIGMA DELTA MODULATORS

BACKGROUND

Electronic systems can include analog-to-digital converters (ADCs). Converting analog signals to digital quantities allows processors of electronic systems to perform signal processing functions for the systems. The sigma-delta ADC is one type of ADC and is widely used in converting signals in the audio band, in precision industrial measurement applications, and in narrow band internet of things (IoT) applications. Some applications are power constrained and have a limited energy source (e.g., battery powered applications). The present inventors have recognized a need for reducing the power consumption of sigma-delta ADCs.

Overview

This document relates generally to sigma-delta analog-to-digital converter (ADC) circuits, and in particular to improving the energy used by sigma-delta ADC circuits. An example apparatus includes a sigma-delta ADC circuit to convert an analog input signal to a digital value. The sigma-delta ADC circuit includes a loop filter circuit including at least one loop filter amplifier, a flash ADC circuit including multiple comparators, and a bias control circuit configured to change a biasing of the at least one loop filter amplifier according to outputs of the multiple comparators of the flash ADC circuit.

An example method includes receiving an input signal at an input of the sigma-delta ADC, wherein the delta-sigma ADC includes a flash ADC circuit and a loop filter circuit that includes at least one loop filter amplifier, determining a digital value for the input signal using the flash ADC circuit, and adjusting biasing of the at least one loop filter amplifier according to outputs of multiple comparators of the flash ADC circuit.

An example integrated circuit includes a sigma-delta ADC circuit configured to convert an analog input signal to a digital value. The sigma-delta ADC circuit includes a loop filter circuit including at least one loop filter amplifier, a flash ADC circuit having an output, a bias circuit, and a bias control circuit. The bias circuit includes a static bias circuit stage that provides a static bias current for the at least one loop filter amplifier, and a dynamic bias circuit stage that provides a dynamic bias current for the at least one loop filter amplifier. The bias control circuit is configured to change the dynamic bias current according to the flash ADC circuit output.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
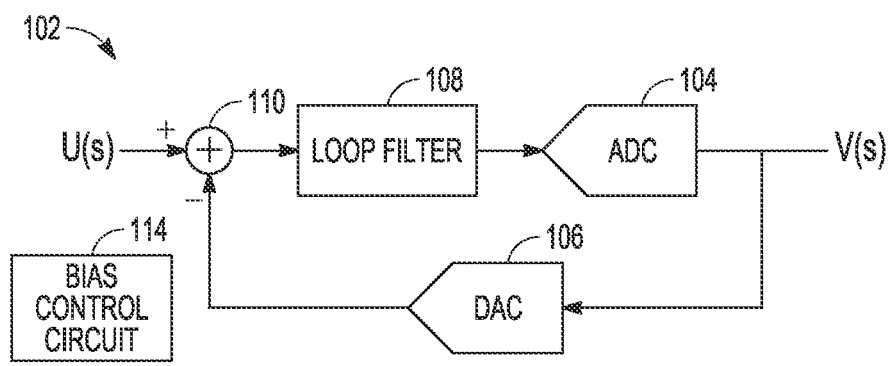
FIG. 1 is a block diagram of an example of a sigma-delta analog-to-digital converter (sigma-delta ADC).

FIG. 1 is a block diagram of an example of a sigma-delta analog-to-digital converter (ADC) circuit 102. The sigma-delta ADC circuit 102 includes a flash ADC circuit 104, a feedback digital-to-analog converter (DAC) circuit 106, and a loop filter circuit 108. The sigma-delta ADC 102 converts an input signal (U(s)) into a quantized output signal (V(s)) that is a continuous stream of binary numbers output at a rate determined by the sampling clock frequency. The DAC circuit 106 is driven by the serial output data stream to generate a feedback signal. The output of the DAC circuit 106 is subtracted from the input signal using a summing element 110. The loop filter circuit 108 includes one or more integrators.

Figure 2:
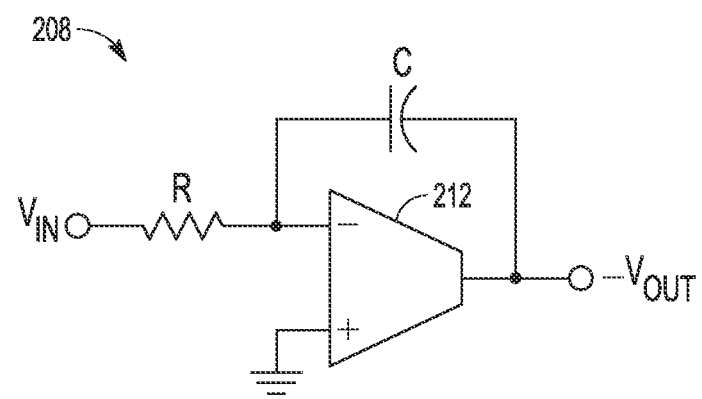
FIG. 2 is a circuit diagram of a loop filter circuit.

FIG. 2 is a circuit diagram of a loop filter circuit 208. The loop filter circuit 208 includes at least one integrator stage. The integrator stage includes an operational amplifier 212 and a capacitor C connected from the output of the amplifier 212 to an input of the amplifier 212.

Returning to FIG. 1, the loop filter circuit 108 integrates the output of summing element 110, and the output of the loop filter circuit 108 is applied to the comparators of the flash ADC circuit 104. The loop filter circuit 108 reduces quantization noise due to the quantization by the flash ADC circuit 104. The sigma-delta ADC circuit 102 may be a discrete time sigma-delta modulator (DTSDM) or a continuous time sigma-delta modulator (CTSDM). In a DTSDM, the input signal is sampled before the summing element 110. In a CTSDM, the input signal is sampled after the loop filter circuit 108.

For many applications (e.g., an audio codec), the input signal for a sigma-delta modulator has a small amplitude with occasional changes to a large amplitude. The amplifier or amplifiers of the loop filter circuit 108 are biased with a higher bias current in anticipation of large amplitudes in the input signal to avoid distortion when the large amplitudes occur. This approach can be wasteful for a power-constrained system. An improvement would be to keep the bias current of the amplifiers low when the amplitude of the input signal is small and change to using a high bias current when the amplitude of the input signal occasionally becomes large. This adaptive biasing based on the amplitude of the input signal could reduce the static power consumed by sigma-delta modulators.

Figure 3:
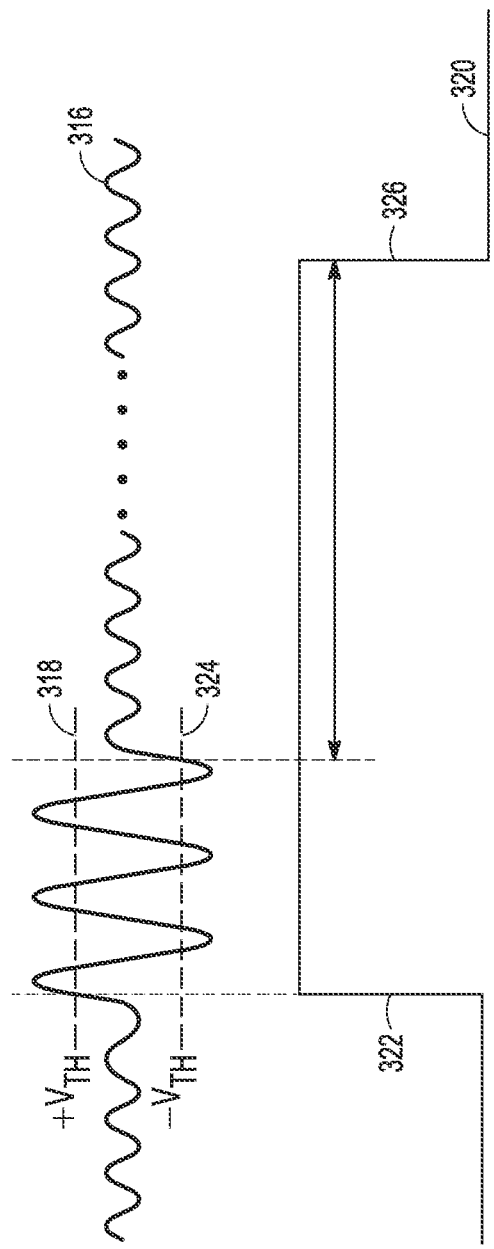
FIG. 3 is an illustration of waveforms associated with adaptive biasing of an amplifier.

FIG. 3 is an illustration of waveforms showing the adaptive biasing. The top waveform 316 is the input signal (U(s)). When the amplitude of the input signal is small, the requirements for slew rate and total harmonic distortion (THD) of the amplifiers can be relaxed. The DC bias current or currents of the amplifiers can be reduced to conserve power. When the input signal has a large amplitude, the DC bias current should be increased to high power mode to improve large signal performance.

In the example of FIG. 3, the amplitude of the input signal becomes large enough at 318 to trigger a high power mode in the amplifier biasing. The lower waveform 320 shows activation of the high power mode in response to the increase in amplitude. In the example of FIG. 3, the high power mode is activated at 322 when the amplitude of the input signal exceeds the thresholds +Vth and −Vth. The speed of the transition from low power to high power should be quick to avoid low performance degradation. At 324, the input signal amplitude decreases to less than the +Vth and −Vth thresholds. At 326, the circuit transitions from high power mode to low power mode. The change from high power mode to low power mode does not happen right away. Large amplitudes in the input signal may occur in bursts. The transition to the low power mode is slow so that the high power mode is still active if another large signal amplitude follows shortly after the preceding one.

An approach to adaptive biasing should provide a transition between low power mode and high power mode with a negligible impact on the stability of the sigma-delta modulators. The bias of the amplifiers should be tunable to a high power mode bias and to a low power mode bias. The approach should have a signal level detector with a fast transition to high power mode and delay in the transition back to low power mode.

Figure 4:
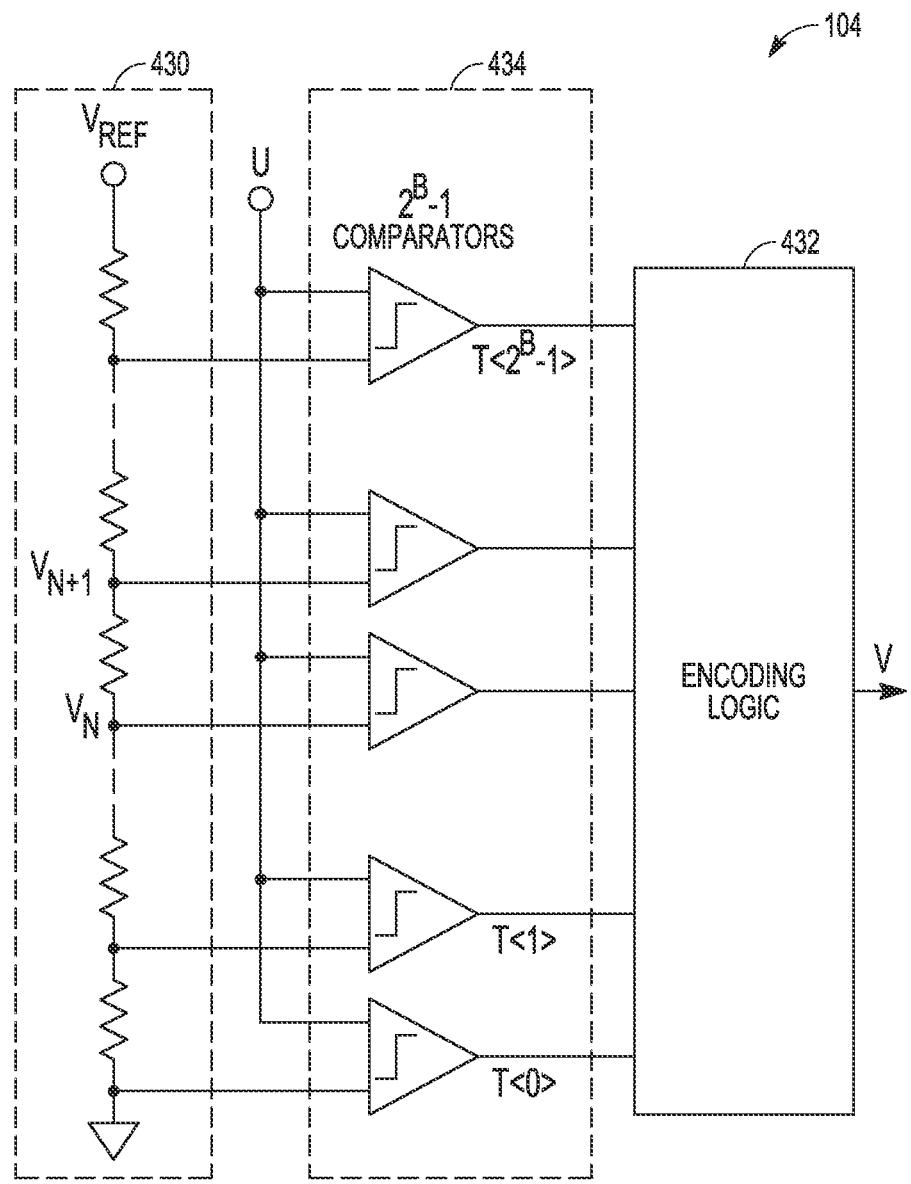
FIG. 4 is a circuit diagram of an example of a flash ADC circuit

FIG. 4 is a circuit diagram of an example of a flash ADC circuit 104. The flash ADC circuit may be used in the sigma-delta ADC circuit 102 of FIG. 1. The flash ADC circuit 104 receives an input signal (U) and compares the sampled input voltage to weighted reference voltages. In the example of FIG. 4, the weighted reference voltages are produced using a resistive divider circuit 430. The output of a comparator is an active level (e.g., "high" or a "1") when the input signal is greater than the weighted reference voltage. Encoding logic circuitry 432 generates a B-bit digital value at the output (V), with B being from 3-5 bits. For a B-bit flash ADC circuit, there are $2^B-1$ comparators 434, and the outputs of the $2^B-1$ comparators 434 are encoded into the B-bit value.

Figure 5:
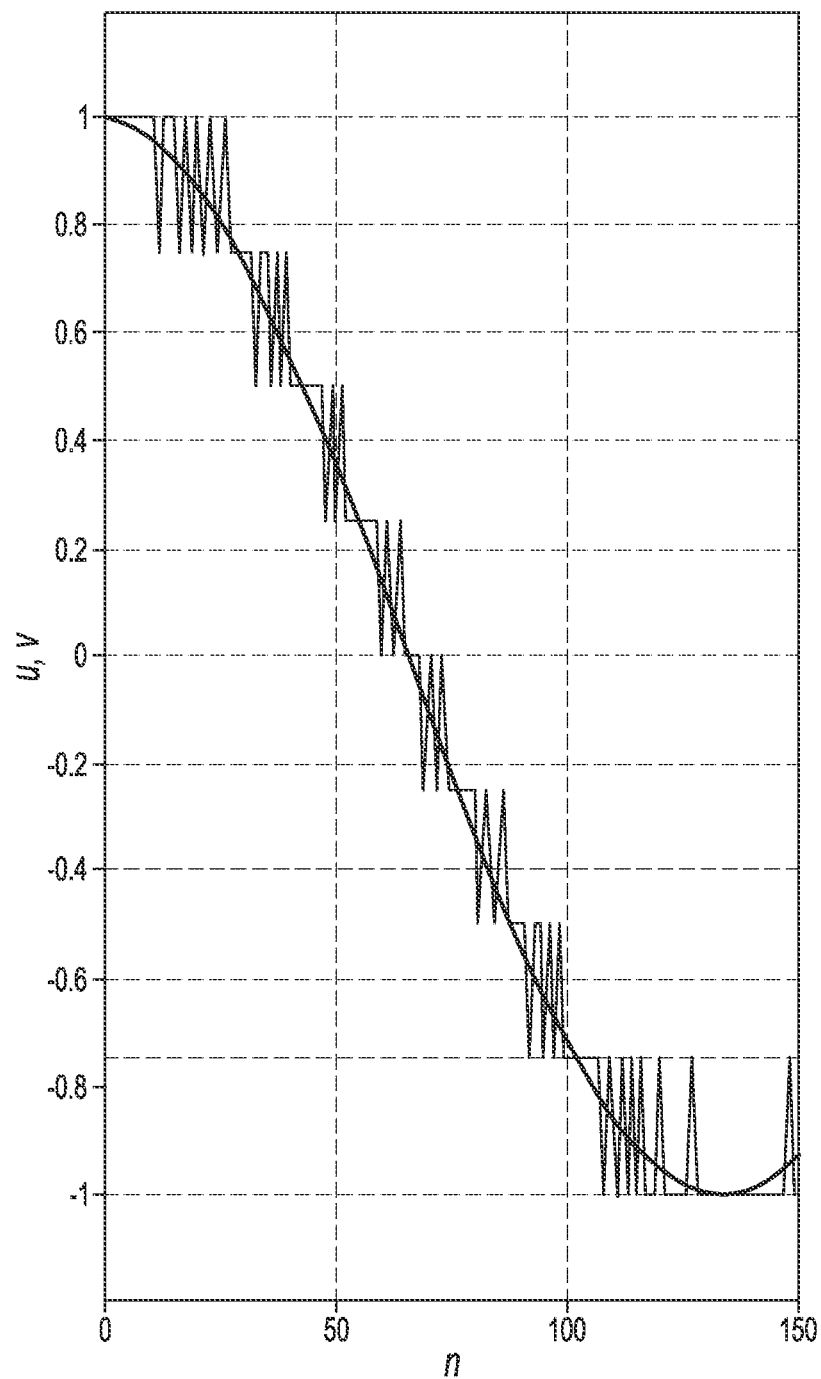
FIG. 5 is a graph of an input signal and an output signal of a sigma-delta ADC.

The output signal (V) of the flash ADC circuit 104 can be expressed as $$V=U+NTF*e,$$

where U is the input signal, NTF is a noise transfer function and e is quantization noise FIG. 5 is a graph of voltage versus samples (n) showing the waveforms for the input signal (U) and the output signal (V). The smooth waveform is the input signal (U). The output signal (V) toggles around the input signal. If the input signal (U) is large, the quantization noise is small due to the multiple levels of the flash ADC circuit 104, and this means that the output of the flash ADC 104 is a good estimation of the input signal. Thus, the flash ADC circuit 104 can be used as a signal level detector to determine when to change the bias current for the loop filter circuit 108. For example, the outputs (T<0>, T<1> . . . T<$2^B-1$>) of the comparators 434 of the flash ADC circuit 104 can be used to gauge the level of the input signal.

Figure 6:
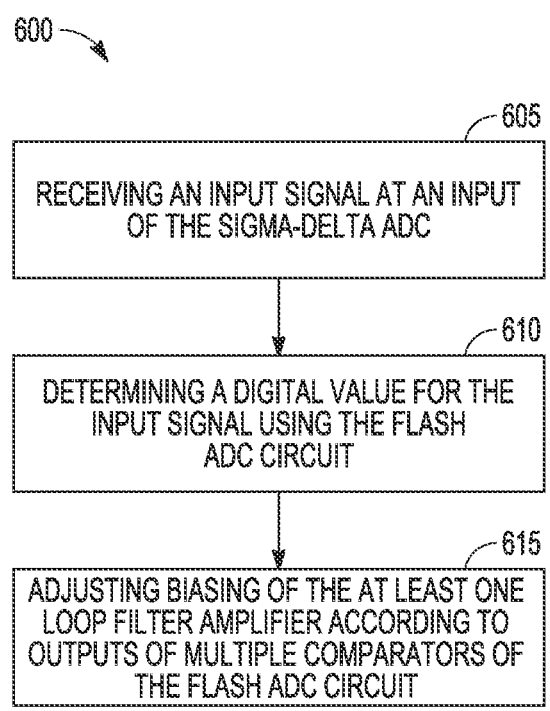
FIG. 6 is a flow diagram of an example of a method of controlling operation of a sigma-delta ADC.

As an overview, FIG. 6 is a flow diagram of an example of a method 600 of controlling operation of a sigma-delta ADC, such as the sigma-delta ADC 102 of FIG. 1. At 605, an input signal at an input of the sigma-delta ADC 102. The input signal may be sampled before the summing element 110 or after the loop filter circuit 108. At 610, a digital value is determined for the input signal using the flash ADC circuit 104. At 615, the biasing of at least one amplifier of the loop filter circuit 108 is adjusted by the bias control circuit 114 according to outputs of the comparators of the flash ADC circuit 104.

Figure 7:
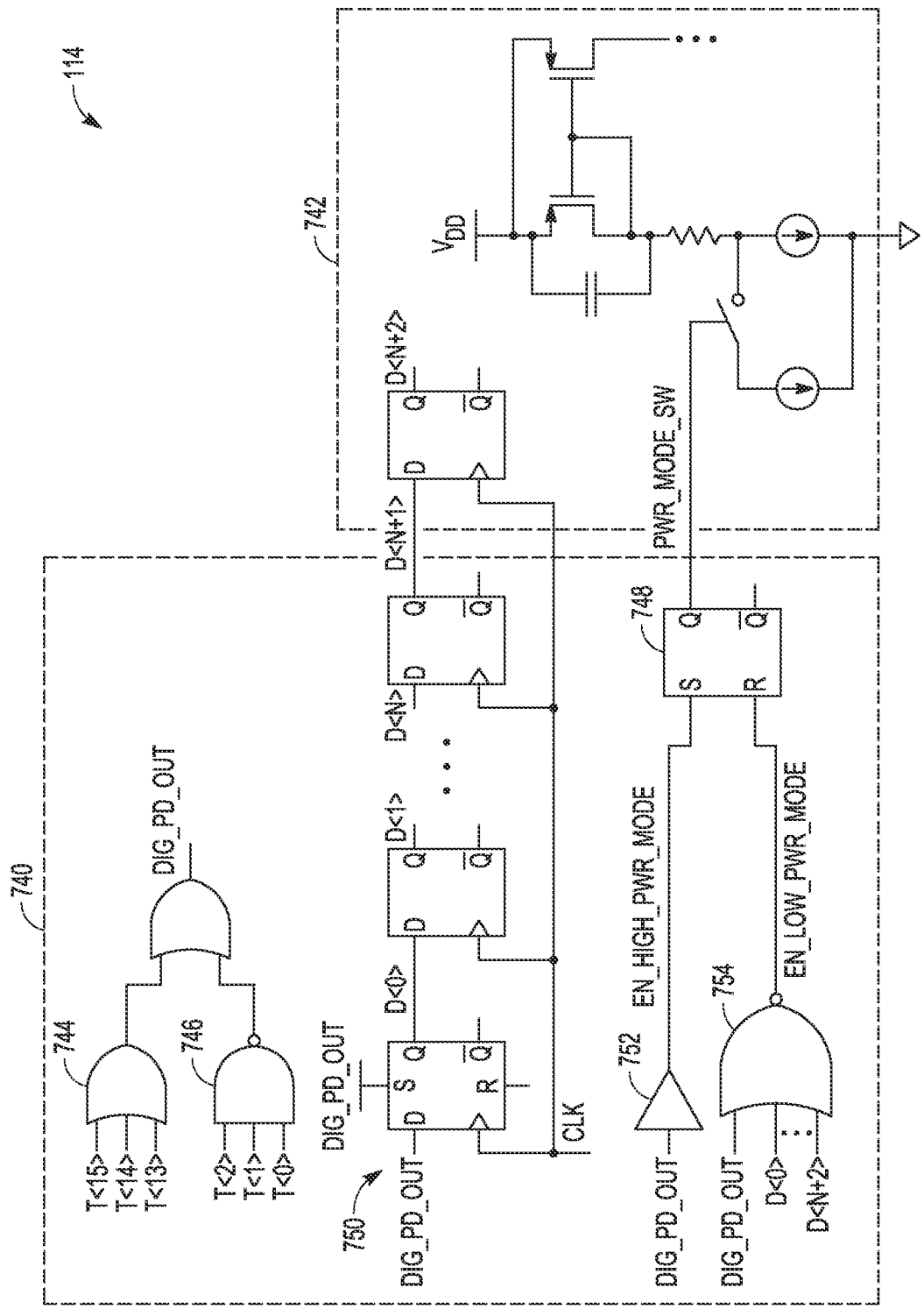
FIG. 7 is a circuit schematic of portions of an example of a bias control circuit for a sigma-delta ADC.

FIG. 7 is a circuit schematic of portions of an example of the bias control circuit 114 of FIG. 1. The bias control circuit 114 includes a signal level detector circuit 740 and a bias circuit 742. The signal level detector circuit 740 monitors the outputs of the comparators of the flash ADC circuit 104 to determine the level of the input signal.

Because the comparators 434 of the flash ADC circuit 104 compare the sampled input signal to weighted reference voltages, the outputs of the comparators 434 form a weighted output code. For example, if the flash ADC circuit 104 is a 4-bit flash ADC (i.e., B=4), the weighted code is the output state of the 16 comparators T<15>, T<14> . . . T<0>. The weighted code includes a "1" in bit positions where the input signal is greater than the weighted reference voltage. The signal level detector circuit 740 enables a change to the bias current of one or more loop filter amplifiers according to the weighted output code.

In the example of FIG. 7, the bias control circuit 114 includes a signal level detector circuit 740. In the example of FIG. 7, the signal level detector circuit 740 monitors the outputs of M of the most significant bits (MSBs) of the weighted code using OR gate 744 and monitors the M least significant bits (LSBs) of the weighted code using NAND gate 746, where M is an integer greater than one. In the example of FIG. 7, M=3 and comparator outputs T<15>, T<14>, T<13> and T<2>, T<1> T<0> are monitored. Based on the logic of the signal level detector circuit 740, the signal level detector circuit 740 enables high power mode when any of the M MSBs is a "1" or any of the M LSBs is a "0" by setting latch circuit 748.

The bias circuit 742 includes a static bias circuit stage and a dynamic bias circuit stage. In both the low power mode and the high power mode, the bias circuit 742 provides a static bias current to the loop filter amplifier using the static current source of the static bias circuit stage. When high power mode is enabled, the dynamic bias circuit stage provides a dynamic bias current to the loop filter amplifier using the dynamic current source. The dynamic bias current is added to the static bias current to increase the biasing of the amplifier in the high power mode. Only one dynamic current source is shown for simplicity of the circuit schematic. Other examples can include a dynamic bias circuit stage having multiple dynamic current sources that can be enabled individually or in combination to provide a dynamic bias current that is selectable according to different levels of the input signal to implement multiple high power modes.

Returning to FIG. 3, it can be seen at 322 that the activation time to the higher bias current is fast and the high power mode is enabled as soon as the signal level detector circuit 740 detects that the input signal exceeds the detection threshold. It can also be seen at 324 that the activation time to the lower bias current is slower and the low power mode is enabled several sample times after the level of the input signal decreases below the threshold.

In the example of FIG. 7, based on the logic of the signal level detector circuit 740, the signal level detector circuit 740 deactivates the high power mode enable when the M MSBs are "1s" or and the M LSBs are "0s". The deactivated signal propagates through shift register 750. When the flip-flop circuits of the shift register 750 are all low, the latch circuit 748 is reset and the bias current of the loop filter amplifier is reduced to the static bias current.

The deactivated signal propagates through the shift register 750 according to the sample clock. The flip-flop circuits will all be low to deactivate the high power mode if the level of the input signal remains below the detection threshold for a time long enough for the low level to propagate to all the flip-flop circuits. If the input level signal becomes greater than the detection threshold before the low level can propagate through the shift register, the high power mode remains active. The input signal needs to remain below the threshold for the number of sample clocks determined by the shift register before the bias control circuit 114 returns to the low power mode and the lower bias current.

Figure 8:
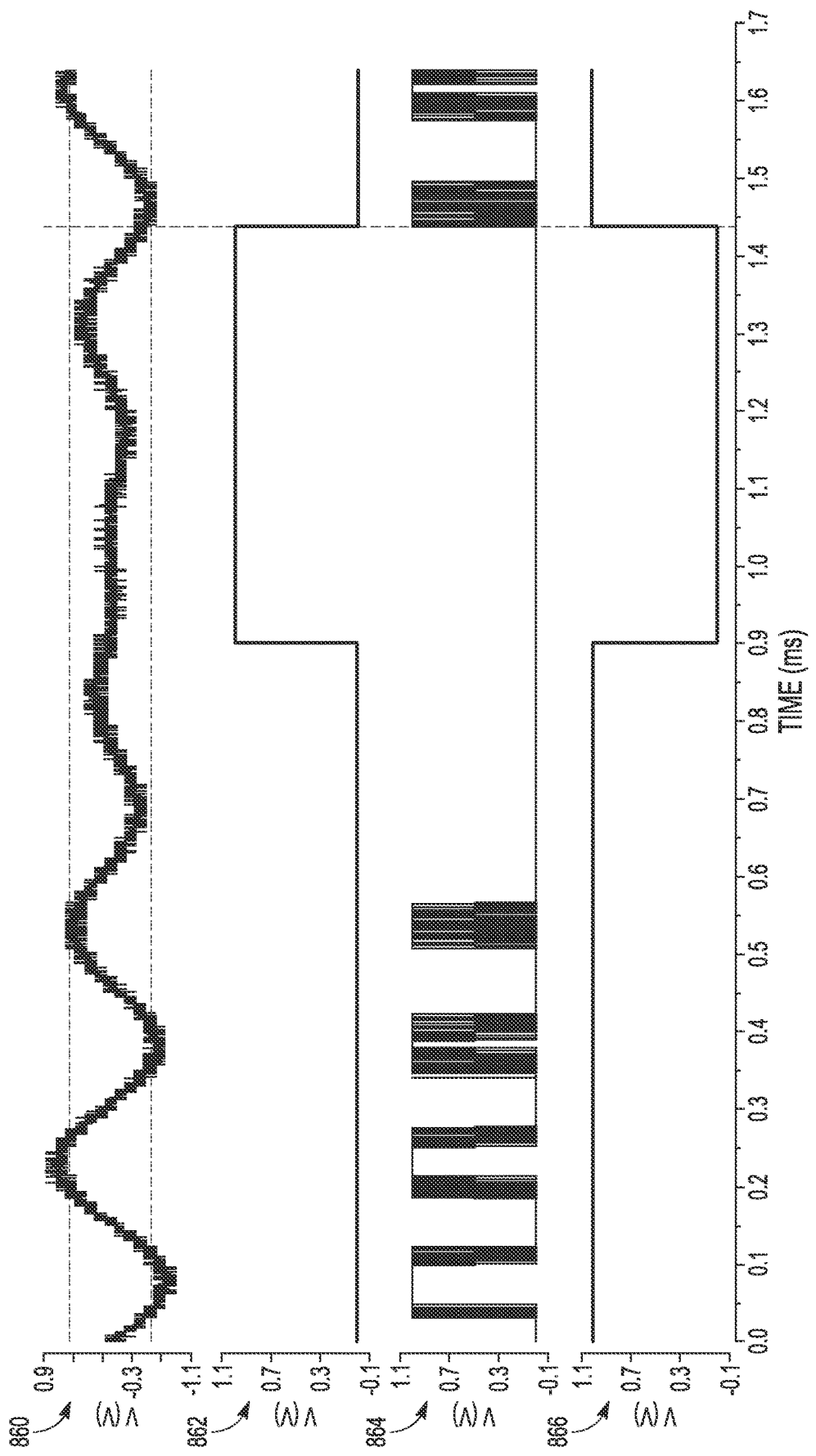
FIG. 8 is a simulation of the bias control circuit of FIG. 7.

FIG. 8 is a simulation result of the bias control circuit 114 logic circuitry of FIG. 7. The top waveform 860 is the output of the flash ADC circuit 104 of FIG. 1 or FIG. 4. Waveform is the enable for low power mode and is high for enabling the low power mode. The amplitude of the waveform 860 is decreasing. Because of the quantization noise in the output of the flash ADC circuit 104, the enable signal toggles when the output of the flash ADC circuit 104 is near a detection threshold. Waveform 866 is the output of the latch circuit 748 in FIG. 7 and is high for high power mode. The waveform 866 shows that the bias circuit 742 remains in high power mode despite the toggling of the waveform 864. Waveform 862 is the output of the NOR gate 754 in FIG. 7 and is the enable low power mode signal. Low power mode is enabled when the signal is high. Waveform 862 shows the hysteresis time before the bias control circuit 114 transitions to the low power mode. Waveform 866 shows that the bias control circuit 114 quickly transitions to the high power mode when the input signal becomes greater than the detection threshold as shown in waveform 860. This hysteresis time in the transition to low power mode improves the stability of the sigma-delta ADC 102.

Figure 9:
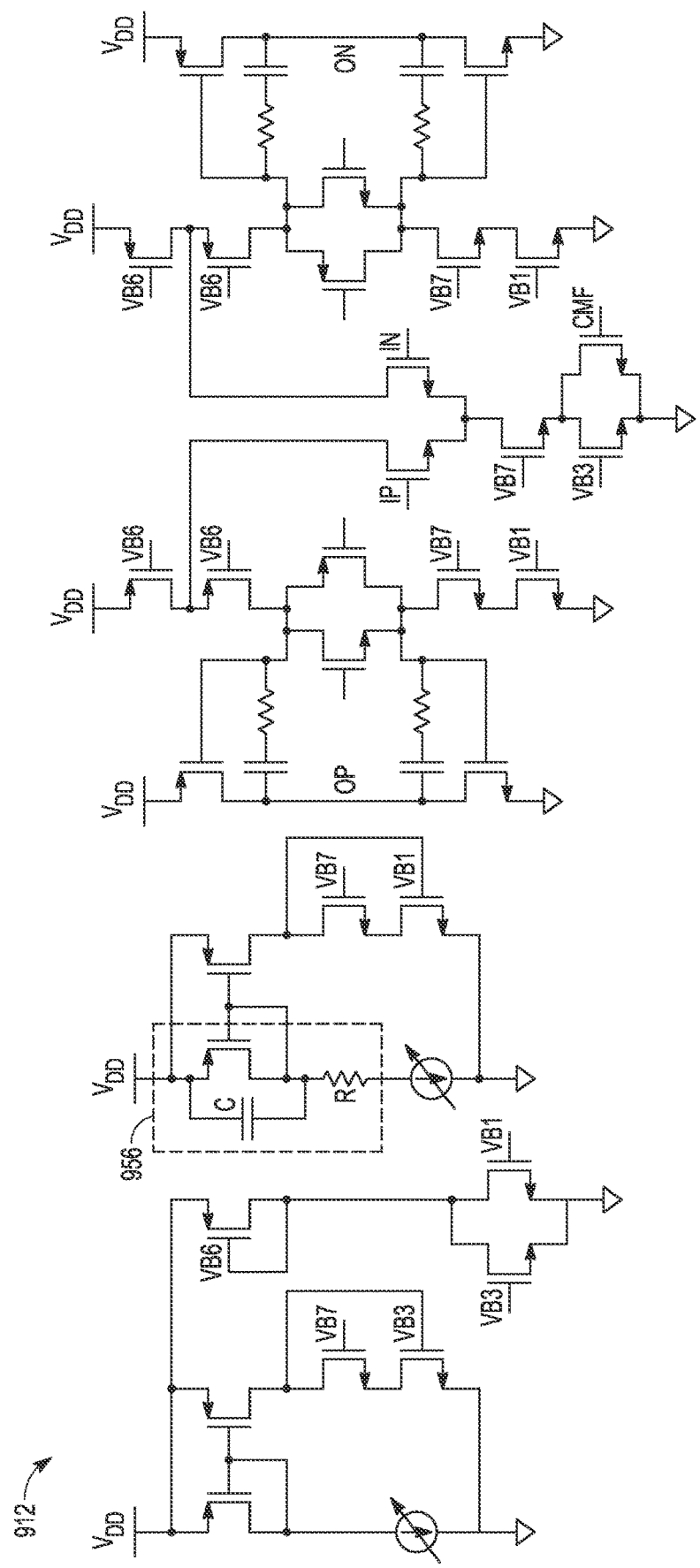
FIG. 9 is a circuit diagram of an example of a loop filter amplifier.

FIG. 9 is a circuit diagram of an example of a loop filter amplifier 912. The amplifier has a Montichelli amplifier topology with a differential input and differential output, but the loop filter amplifier 912 may have other topologies. The loop filter amplifier 912 has an adaptive bias circuit network and includes a static bias circuit stage and a dynamic bias circuit stage. The bias voltage VB3 stays constant, and the static bias circuit stage provides a static bias current that stays constant. Bias voltage VB1 changes according to the high power mode signal from the signal level detector circuit 740, and the dynamic bias circuit stage provides a dynamic bias current according to the high power mode signal. The dynamic bias circuit stage includes a slew rate circuit 956. The slew rate circuit 956 includes a resistor-capacitor (RC) filter to slow the slew rate of the dynamic bias current. Slowing the slew rate can reduce glitches in the output common mode of the loop filter amplifier 912.

Figure 10:
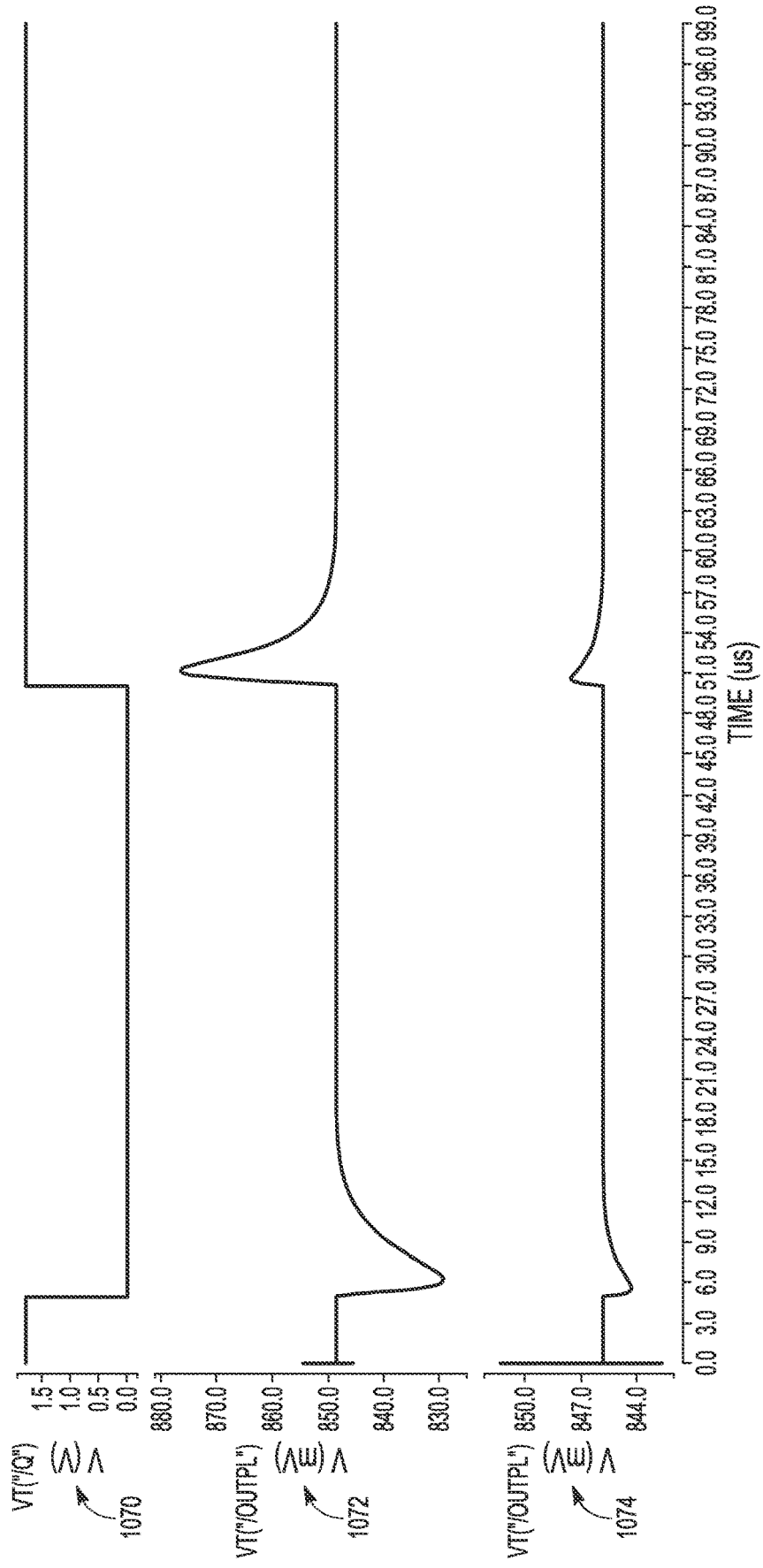
FIG. 10 is a simulation of the loop filter amplifier of FIG. 9

FIG. 10 is a simulation result of the loop filter amplifier 912 of FIG. 9. The simulation shows the advantages of using a static bias circuit stage and a dynamic bias circuit stage instead of using only a dynamic bias circuit stage. Waveform 1070 shows the power mode of the biasing of the amplifier with high representing high power mode, and a transition from high to low representing a transition from high power mode to low power mode. Waveform 1072 is the output common mode of the loop filter amplifier 912 during transitions between the high power mode and low power mode with only a dynamic bias circuit stage and no static bias circuit stage. Waveform 1074 is the output common mode of the loop filter amplifier 912 during transitions between the high power mode and low power mode with both a dynamic bias circuit stage and a static bias circuit stage. A comparison of waveform 1072 and waveform 1074 shows that glitches in the output common mode are reduced by using both the static bias circuit stage and a dynamic bias circuit stage.

The several devices and methods described herein improve the dynamic range of a sigma-delta ADC and reduce distortion while reducing the amount of static circuit power used to achieve the improved dynamic range and reduced distortion. Using the techniques described herein, the transition between low power mode and high power mode has a negligible impact on the stability of the sigma-delta modulators.

Additional Description and Aspects

A first Aspect (Aspect 1) includes subject matter (such as an electronic circuit) comprising a sigma-delta analog-to-digital converter (ADC) circuit configured to convert an analog input signal to a digital value. The sigma-delta ADC circuit including a loop filter circuit including at least one loop filter amplifier, a flash ADC circuit including multiple comparators, and a bias control circuit configured to change a biasing of the at least one loop filter amplifier according to outputs of the multiple comparators of the flash ADC circuit.

In Aspect 2, the subject matter of Aspect one optionally includes multiple comparators compare an input voltage to weighted reference voltages and the outputs of the comparators form a weighted output code, and a signal level detector circuit configured to enable a change to the bias current of the at least one loop filter amplifier according to the weighted output code.

In Aspect 3, the subject matter of Aspect 2, optionally includes a bias control circuit configured to change the biasing of the at least one loop filter amplifier from a lower bias current level to a higher bias current level using a high bias activation time, and change the biasing of the at least one loop filter amplifier from the higher bias current level to the lower bias current level using a low bias activation time, wherein the low bias activation is longer than the high bias activation time.

In Aspect 4, the subject matter of one or both of Aspects 2 and 3 optionally includes include at least two times M (2*M) comparators, and the weighted output code includes M most significant bits (MSBs) and M least significant bits (LSBs), where M is an integer greater than one; and a bias control circuit to increase the bias current of the at least one loop filter amplifier when any one of the M MSBs is an active level or any one of the M LSBs is an inactive level.

In Aspect 5, the subject matter of Aspect 4 optionally includes bias control circuit is configured to decrease the bias current of the at least one loop filter amplifier when the M MSBs are the inactive level and the M LSBs are the active level.

In Aspect 6, the subject matter of one or any combination of Aspects 1-5 optionally includes at least one loop filter amplifier includes a bias circuit. The bias circuit includes a static bias circuit stage that provides a static bias current for the at least one loop filter amplifier, and a dynamic bias circuit stage that provides a dynamic bias current for the at least one loop filter amplifier, wherein the bias control circuit is configured to increase or decrease the dynamic bias current according to the output of the multiple comparators of the flash ADC circuit.

In Aspect 7, the subject matter of Aspect 6 optionally includes a dynamic bias circuit stage that includes a slew rate circuit configured to slow the slew rate of the dynamic bias current.

In Aspect 8, the subject matter of one or any combination of Aspects 1-7 optionally includes at least one loop filter amplifier that includes a dynamic bias circuit stage configured to provide a selectable bias current from among multiple bias currents, and a bias control circuit is configured to select the bias current according to the outputs of the multiple comparators of the flash ADC circuit.

In Aspect 9, the subject matter of one or any combination of Aspects 1-8 optionally includes a sigma-delta ADC circuit is a continuous time sigma-delta modulator.

In Aspect 10, the subject matter of one or any combination of Aspects 1-8 optionally includes a sigma-delta ADC circuit is a discrete time sigma-delta modulator.

Aspect 11 includes subject matter (such as a method of controlling operation of a sigma-delta analog-to-digital converter (ADC)), or can optionally be combined with one or any combination of Aspects 1-10 to include such subject matter, comprising receiving an input signal at an input of the sigma-delta ADC, wherein the delta-sigma ADC includes a flash ADC circuit and a loop filter circuit that includes at least one loop filter amplifier, determining a digital value for the input signal using the flash ADC circuit, and adjusting biasing of the at least one loop filter amplifier according to outputs of multiple comparators of the flash ADC circuit.

In Aspect 12, the subject matter of Aspect 11 optionally includes comparing the input signal to weighted reference voltages using the flash ADC circuit, forming a weighted output code according to the comparison, and enabling a change to the bias current of the at least one loop filter amplifier according to the weighted output code.

In Aspect 13, the subject matter of Aspect 12 optionally includes changing the biasing of the at least one loop filter amplifier from a lower bias current level to a higher bias current level using a high bias activation time, and changing the biasing of the at least one loop filter amplifier from the higher bias current level to the lower bias current level using a low bias activation time, wherein the low bias activation is longer than the high bias activation time.

In Aspect 14, the subject matter of one or any combination of Aspect 11-13 optionally includes maintaining a static bias current for the at least one loop filter amplifier regardless of the output of the multiple comparators of the flash ADC circuit, and increasing or decreasing a dynamic bias current for the at least one loop filter amplifier according to the output of the multiple comparators of the flash ADC circuit.

In Aspect 15, the subject matter of Aspect 14 optionally includes slowing a slew rate of the dynamic bias current.

In Aspect 16, the subject matter of one or both of Aspects 14 and 15 optionally includes selecting the bias current according to the outputs of the multiple comparators of the flash ADC circuit.

Aspect 17 includes subject matter (such as an integrated circuit) or can optionally be combined with one or any combination of Aspects 1-16 to include such subject matter, comprising a sigma-delta analog-to-digital converter (ADC) circuit configured to convert an analog input signal to a digital value. The sigma-delta ADC includes a loop filter circuit including at least one loop filter amplifier, a flash ADC circuit having an output, a bias circuit and a bias control circuit. The bias circuit includes a static bias circuit stage that provides a static bias current for the at least one loop filter amplifier, and a dynamic bias circuit stage that provides a dynamic bias current for the at least one loop filter amplifier. The bias control circuit is configured to change the dynamic bias current according to the flash ADC circuit output.

In Aspect 18, the subject matter of Aspect 17 optionally includes a bias control circuit is configured to change the biasing of the at least one loop filter amplifier from a lower bias current level to a higher bias current level using a high bias activation time, and change the biasing of the at least one loop filter amplifier from the higher bias current level to the lower bias current level using a low bias activation time, wherein the low bias activation is longer than the high bias activation time.

In Aspect 19, the subject matter of one or any combination of Aspects 17 and 18 optionally includes a slew rate circuit configured to slow the slew rate of the dynamic bias current.

In Aspect 20, the subject matter of one or any combination of Aspects 17-19 optionally includes at least one loop amplifier that includes a differential input, differential output amplifier circuit.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit, the circuit comprising:
a sigma-delta analog-to-digital converter (ADC) circuit configured to convert an analog input signal to a digital value, the sigma-delta ADC circuit including:
a loop filter circuit including at least one loop filter amplifier;
a flash ADC circuit including multiple comparators; and
a bias control circuit configured to change a biasing of the at least one loop filter amplifier according to outputs of the multiple comparators of the flash ADC circuit.

2. The circuit of claim 1,
wherein the multiple comparators compare an input voltage to weighted reference voltages and the outputs of the comparators form a weighted output code; and
wherein the bias control circuit includes a signal level detector circuit configured to enable a change to the bias current of the at least one loop filter amplifier according to the weighted output code.

3. The circuit of claim 2, wherein the bias control circuit is configured to:
change the biasing of the at least one loop filter amplifier from a lower bias current level to a higher bias current level using a high bias activation time; and
change the biasing of the at least one loop filter amplifier from the higher bias current level to the lower bias current level using a low bias activation time, wherein the low bias activation is longer than the high bias activation time.

4. The circuit of claim 2,
wherein the multiple comparators include at least two times M (2*M) comparators, and the weighted output code includes M most significant bits (MSBs) and M least significant bits (LSBs), where M is an integer greater than one; and
wherein the bias control circuit is configured to increase the bias current of the at least one loop filter amplifier when any one of the M MSBs is an active level or any one of the M LSBs is an inactive level.

5. The circuit of claim 4, wherein the bias control circuit is configured to decrease the bias current of the at least one loop filter amplifier when the M MSBs are the inactive level and the M LSBs are the active level.

6. The circuit of claim 1, wherein the at least one loop filter amplifier includes a bias circuit including:
a static bias circuit stage that provides a static bias current for the at least one loop filter amplifier; and
a dynamic bias circuit stage that provides a dynamic bias current for the at least one loop filter amplifier, wherein the bias control circuit is configured to increase or decrease the dynamic bias current according to the output of the multiple comparators of the flash ADC circuit.

7. The circuit of claim 6, wherein the dynamic bias circuit stage includes a slew rate circuit configured to slow the slew rate of the dynamic bias current.

8. The circuit of claim 1,
wherein the at least one loop filter amplifier includes a dynamic bias circuit stage configured to provide a selectable bias current from among multiple bias currents; and
wherein the bias control circuit is configured to select the bias current according to the outputs of the multiple comparators of the flash ADC circuit.

9. The circuit of claim 1, wherein the sigma-delta ADC circuit is a continuous time sigma-delta modulator (CTSDM).

10. The circuit of claim 1, wherein the sigma-delta ADC circuit is a discrete time sigma-delta modulator (DTSDM).

11. A method of controlling operation of a sigma-delta analog-to-digital converter (ADC), the method comprising:
receiving an input signal at an input of the sigma-delta ADC, wherein the delta-sigma ADC includes a flash ADC circuit and a loop filter circuit that includes at least one loop filter amplifier;
determining a digital value for the input signal using the flash ADC circuit; and
adjusting biasing of the at least one loop filter amplifier according to outputs of multiple comparators of the flash ADC circuit.

12. The method of claim 11,
comparing the input signal to weighted reference voltages using the flash ADC circuit;
forming a weighted output code according to the comparison; and
enabling a change to the bias current of the at least one loop filter amplifier according to the weighted output code.

13. The method of claim 12, wherein the adjusting the biasing of the at least one loop filter amplifier includes:
changing the biasing of the at least one loop filter amplifier from a lower bias current level to a higher bias current level using a high bias activation time; and
changing the biasing of the at least one loop filter amplifier from the higher bias current level to the lower bias current level using a low bias activation time, wherein the low bias activation is longer than the high bias activation time.

14. The method of claim 11, wherein the adjusting the biasing of the at least one loop filter amplifier includes:
maintaining a static bias current for the at least one loop filter amplifier regardless of the output of the multiple comparators of the flash ADC circuit; and
increasing or decreasing a dynamic bias current for the at least one loop filter amplifier according to the output of the multiple comparators of the flash ADC circuit.

15. The method of claim 14, including slowing a slew rate of the dynamic bias current.

16. The method of claim 14, wherein the increasing or decreasing the dynamic bias current for the at least one loop filter amplifier includes selecting the bias current according to the outputs of the multiple comparators of the flash ADC circuit.

17. An integrated circuit comprising:
a sigma-delta analog-to-digital converter (ADC) circuit configured to convert an analog input signal to a digital value, the sigma-delta ADC circuit including:
a loop filter circuit including at least one loop filter amplifier;
a flash ADC circuit having an output;
a bias circuit including:
a static bias circuit stage that provides a static bias current for the at least one loop filter amplifier; and
a dynamic bias circuit stage that provides a dynamic bias current for the at least one loop filter amplifier; and
a bias control circuit configured to change the dynamic bias current according to the flash ADC circuit output.

18. The integrated circuit of claim 17, wherein the bias control circuit is configured to:
    change the biasing of the at least one loop filter amplifier from a lower bias current level to a higher bias current level using a high bias activation time; and
    change the biasing of the at least one loop filter amplifier from the higher bias current level to the lower bias current level using a low bias activation time, wherein the low bias activation is longer than the high bias activation time.

19. The integrated circuit of claim 17, wherein the dynamic bias circuit stage includes a slew rate circuit configured to slow the slew rate of the dynamic bias current.

20. The integrated circuit of claim 17, wherein the at least one loop amplifier includes a differential input, differential output amplifier circuit.

\* \* \* \* \*